United States Patent
Jiang et al.

(10) Patent No.: US 11,150,265 B2
(45) Date of Patent: Oct. 19, 2021

(54) SINGLE PROOF MASS BASED THREE-AXIS ACCELEROMETER

(71) Applicant: MEMSIC Semiconductor (TIANJIN) Co., Ltd., Tianjin (CN)

(72) Inventors: Leyue Jiang, Wuxi (CN); Yang Zhao, Andover, MA (US)

(73) Assignee: MEMSIC Semiconductor (TIANJIN) Co., Ltd., Tianjin (CN)

( * ) Notice: Subject to any disclaimer, the term of this patent is extended or adjusted under 35 U.S.C. 154(b) by 0 days.

(21) Appl. No.: 17/082,024

(22) Filed: Oct. 28, 2020

(65) Prior Publication Data
US 2021/0132107 A1     May 6, 2021

(30) Foreign Application Priority Data
Oct. 31, 2019  (CN) .......................... 201911054180.0

(51) Int. Cl.
| | | |
|---|---|---|
| *G01P 15/125* | (2006.01) | |
| *G01P 15/08* | (2006.01) | |
| *G01P 15/13* | (2006.01) | |

(52) U.S. Cl.
CPC .......... *G01P 15/13* (2013.01); *G01P 15/0802* (2013.01); *G01P 15/125* (2013.01); *G01P 2015/082* (2013.01); *G01P 2015/084* (2013.01); *G01P 2015/086* (2013.01); *G01P 2015/0822* (2013.01); *G01P 2015/0848* (2013.01)

(58) Field of Classification Search
CPC ....... G01P 2015/082; G01P 2015/0822; G01P 2015/0831; G01P 2015/0848; G01P 2015/0857; G01P 2015/086
See application file for complete search history.

(56) References Cited

U.S. PATENT DOCUMENTS

| | | | | |
|---|---|---|---|---|
| 2008/0314147 A1* | 12/2008 | Nasiri | ................... | G01P 15/125 |
| | | | | 73/514.32 |
| 2010/0107763 A1* | 5/2010 | Lin | ........................ | G01P 15/18 |
| | | | | 73/514.32 |
| 2017/0184628 A1* | 6/2017 | Hsu | ...................... | B81B 3/0072 |

* cited by examiner

*Primary Examiner* — Jill E Culler
*Assistant Examiner* — Ruben C Parco, Jr.
(74) *Attorney, Agent, or Firm* — EcoTech Law Group, P.C.

(57) ABSTRACT

The present invention discloses a three-axis accelerometer. The three-axis accelerometer comprises: a substrate; at least one anchor block fixedly disposed on the substrate; a first X-axis electrode, a second X-axis electrode, a first Y-axis electrode, a second Y-axis electrode, a first Z-axis electrode and a second Z-axis electrode all fixedly disposed on the substrate; a framework suspended above the substrate and comprising a first beam column, a second beam column disposed opposite to the first beam column and at least one connecting beam connecting the first beam column and the second beam column; a proof mass suspended above the substrate; and at least one elastic connection component configured to elastically connect to the at least anchor block, the connecting beam, and the proof mass. The three-axis accelerometer can realize high-precision acceleration detection on three axes with only one proof mass, and in particular, can provide a fully differential detection signal for the Z axis, thereby greatly improving detection precision.

5 Claims, 4 Drawing Sheets

SINGLE PROOF MASS BASED THREE-AXIS ACCELEROMETER

RELATED APPLICATION

This application claims the priority from CN Application having serial number 201911054180.0, filed on Oct. 31, 2019, which are incorporated herein by reference for all purposes.

FIELD OF THE INVENTION

The present invention relates to the field of micro-electro-mechanical systems (MEMS), and in particular, to a single proof mass based three-axis accelerometer.

BACKGROUND TECHNIQUE

A MEMS accelerometer is widely used as a motion sensor. Compared with conventional accelerometers, it has advantages of small size, light weight, low power consumption, low cost, good reliability, easy integration, strong overload capacity, batch production and so on. The MEMS accelerometer has become one of the main development directions of accelerometers, and can be widely used in fields such as aeronautics and astronautics, automobile industry, industrial automation, robotics and so on.

A conventional MEMS accelerometer usually work based on Newton's classical mechanics, and generally consist of three parts: a sensitive proof mass, a fixed support, and a detection circuit. The proof mass is attached on the fixed support by means of one or more elastic elements. When an external acceleration occurs, the sensitive proof mass makes a displacement due to inertia, and a magnitude and a direction of the displacement have a specific corresponding relationship with the magnitude and direction of the acceleration. The displacement causes some related physical quantities (such as capacitor, pressure, resistance, and resonant frequency) to change correspondingly. Therefore, if the changes of these physical quantities can be converted into easy-to-measure electrical quantities, such as voltage, current, frequency, etc., through the detection circuit, the displacement of the sensitive proof mass can be measured, thereby indirectly obtaining the acceleration to be measured. In addition, according to the measured acceleration, a speed of the sensitive proof mass may be obtained by performing integral calculation once, and a movement distance of the sensitive proof mass may be obtained by performing integral calculation twice.

However, one mass is usually used to measure the acceleration of two axes currently. Even though one mass can sometimes be used to measure the acceleration of three axes, the detection accuracy of the Z axis is very low.

Therefore, it is necessary to provide an improved solution to solve the foregoing problem.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention generally pertains to provide a three-axis accelerometer, which can provide high-precision acceleration detection on three axes based on one proof mass.

According to one aspect of the present invention, The three-axis accelerometer provided according to one embodiment of the present invention comprises: a substrate; at least one anchor block fixedly disposed on the substrate; a first X-axis electrode, a second X-axis electrode, a first Y-axis electrode, a second Y-axis electrode, a first Z-axis electrode and a second Z-axis electrode all fixedly disposed on the substrate; a framework suspended above the substrate, and comprising a first beam column, a second beam column disposed opposite to the first beam column, and at least one connecting beam connecting the first beam column and the second beam column; a proof mass suspended above the substrate; and at least one elastic connection component configured to elastically connect to the at least anchor block, the connecting beam, and the proof mass. A third Z-axis electrode is formed on the first beam column, a fourth Z-axis electrode is formed on the second beam column, the first Z-axis electrode and the third Z-axis electrode are disposed oppositely to form a first Z-axis capacitor, and the second Z-axis electrode and the fourth Z-axis electrode are disposed oppositely to form a second Z-axis capacitor. A third X-axis electrode and a third Y-axis electrode are formed on the proof mass, the first X-axis electrode and the third X-axis electrode are disposed oppositely to form a first X-axis capacitor, the second X-axis electrode and the third X-axis electrode are disposed oppositely to form a second X-axis capacitor, the first Y-axis electrode and the third Y-axis electrode are disposed oppositely to form a first Y-axis capacitor, and the second Y-axis electrode and the third Y-axis electrode are disposed oppositely to form a second Y-axis capacitor.

In one embodiment, the framework, the proof mass, the at least one elastic connection component, and the at least one anchor block together form a proof mass electrode.

In one embodiment, when there is an acceleration on an X axis, the at least one elastic connection component elastically deforms, the proof mass moves along the X axis, a gap between the first X-axis electrode and the third X-axis electrode changes to cause change of the first X-axis capacitor, a gap between the second X-axis electrode and the third X-axis electrode changes to cause change of the second X-axis capacitor, and the changes of the first X-axis capacitor and the second X-axis capacitor are opposite, so that the acceleration on the X axis is obtained by detecting a change difference between the first X-axis capacitor and the second X-axis capacitor. When there is an acceleration on a Y axis, the elastic connection component elastically deforms, the proof mass moves along the Y axis, a gap between the first Y-axis electrode and the third Y-axis electrode changes to cause change of the first Y-axis capacitor, and a gap between the second Y-axis electrode and the third Y-axis electrode changes to cause change of the second Y-axis capacitor, so that the acceleration on the Y axis is obtained by detecting a change difference between the first Y-axis capacitor and the second Y-axis capacitor. When there is an acceleration on a Z axis, the elastic connection component elastically deforms, the proof mass moves along the Z axis to drive the framework to rotate, a gap between the first Z-axis electrode and the third Z-axis electrode becomes larger or smaller to cause the first Z-axis capacitor to become smaller or larger, and a gap between the second Z-axis electrode and the fourth Z-axis electrode becomes smaller or larger to cause the second Z-axis capacitor to become larger or smaller, so that the acceleration on the Z axis is obtained by detecting a change difference between the first Z-axis capacitor and the second Z-axis capacitor.

The three-axis accelerometer of the present invention can realize high-precision acceleration detection on three axes with only one proof mass, and in particular, can provide a fully differential detection signal for the Z axis, thereby greatly improving the detection precision.

There are many other objects, together with the foregoing attained in the exercise of the invention in the following description and resulting in the embodiment illustrated in the accompanying drawings.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE INVENTION

The detailed description of the invention is presented largely in terms of procedures, steps, logic blocks, processing, and other symbolic representations that directly or indirectly resemble the operations of communication or storage devices that may or may not be coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

The present invention provides a three-axis accelerometer, which may provide high-precision acceleration detection on three axes based on one proof mass.

Figure 1:
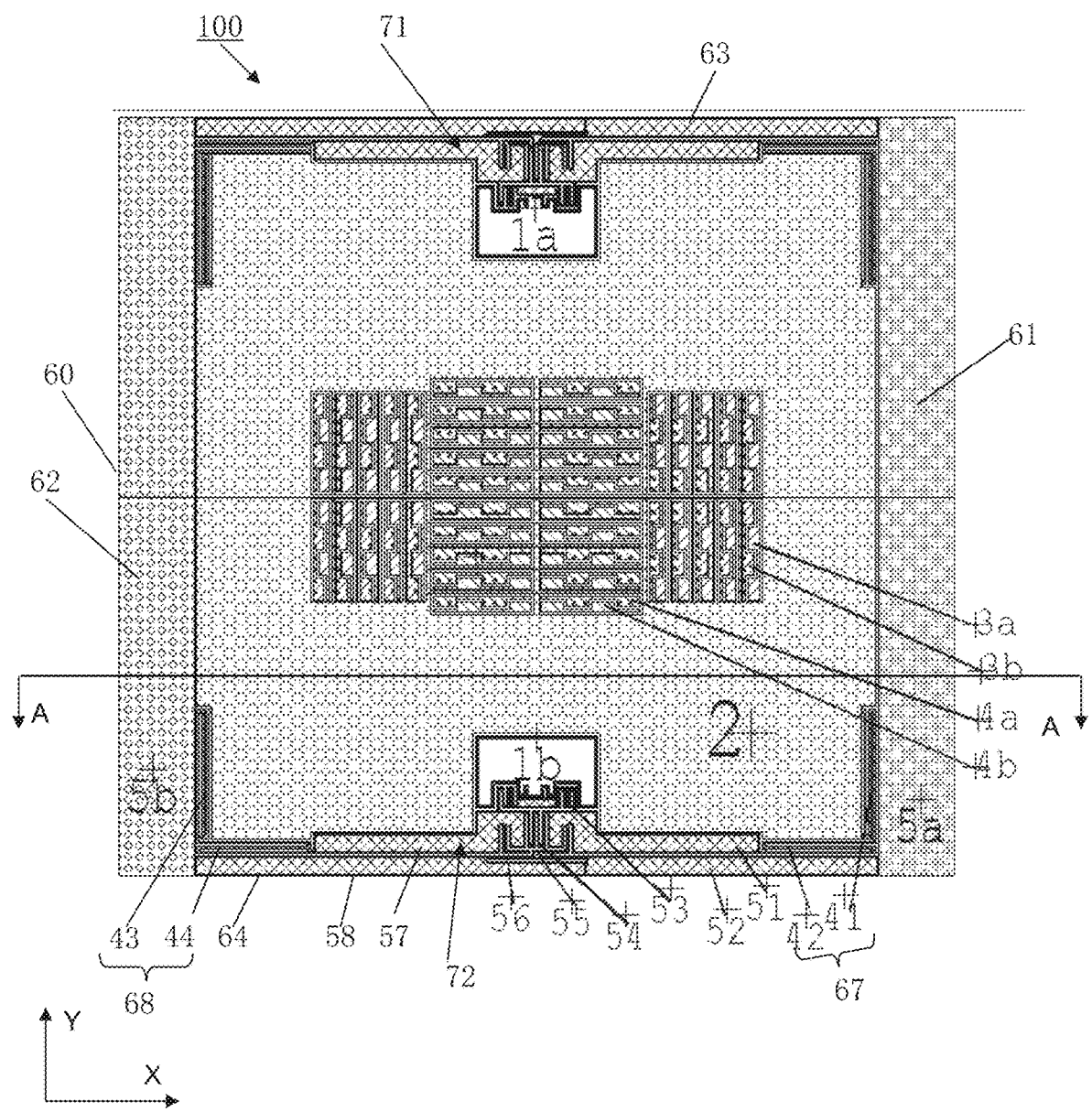
FIG. 1 is a schematic top view of a three-axis accelerometer according to one embodiment of the present invention.
Figure 2:
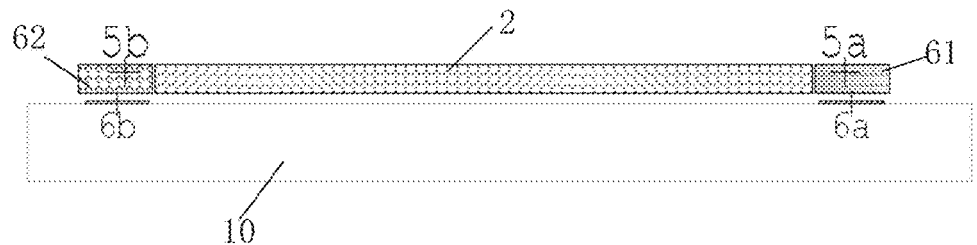
FIG. 2 is a schematic sectional view of the three-axis accelerometer along a section line A-A in FIG. 1.
Figure 3:
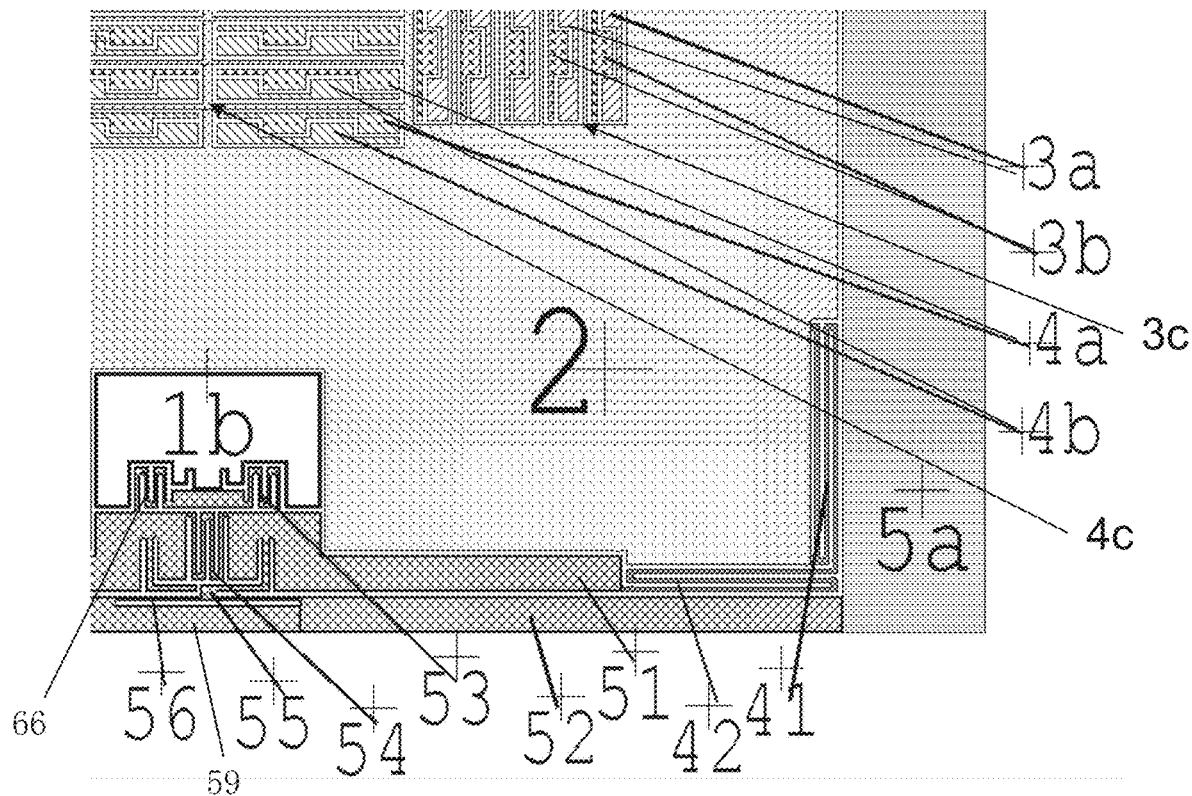
FIG. 3 is an enlarged schematic diagram of a partial structure of the three-axis accelerometer in FIG. 1.
Figure 4:
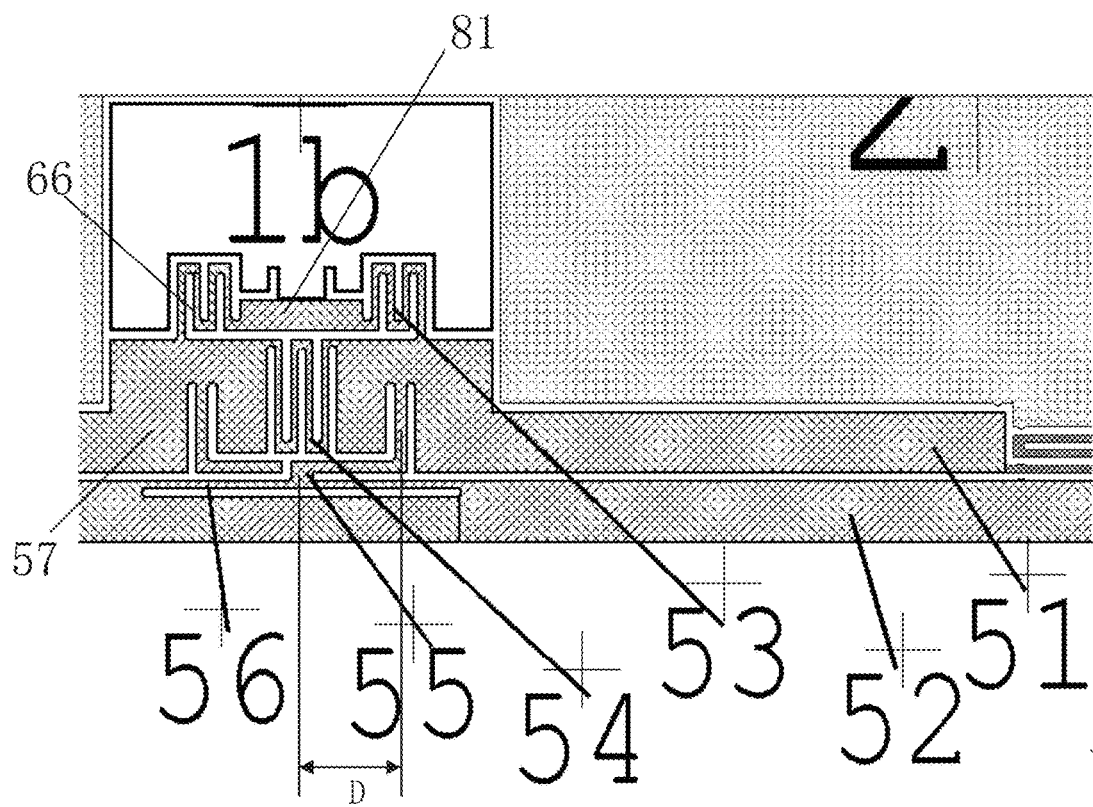
FIG. 4 is a further enlarged schematic diagram of the three-axis accelerometer in FIG. 3.

FIG. 1 is a schematic top view of a three-axis accelerometer according to one embodiment of the present invention. FIG. 2 is a schematic sectional view of the three-axis accelerometer along a section line A-A in FIG. 1. FIG. 3 is an enlarged schematic diagram of a partial structure of the three-axis accelerometer in FIG. 1. FIG. 4 is a further enlarged schematic diagram of the three-axis accelerometer in FIG. 3.

As shown in FIG. 1 and FIG. 2, the three-axis accelerometer 100 includes: a substrate 10; a first anchor block 1a and a second anchor block 1b both fixedly disposed on the substrate 10; a first X-axis electrode 3a, a second X-axis electrode 3b, a first Y-axis electrode 4a, a second Y-axis electrode 4b, a first Z-axis electrode 6a, and a second Z-axis electrode 6b all fixedly disposed on the substrate 10; a framework 60 suspended above the substrate 10 and comprising a first beam column 61, a second beam column 62 opposite to the first beam column 61, a first connecting beam 63 and a second connecting beam 64 connecting the first beam column and the second beam column; a proof mass 2 suspended above the substrate 10; a first elastic connection component 71 and a second elastic connection component 72. The first elastic connection component 71 is elastically connected to the first anchor block 1a, the first connecting beam 63 and the proof mass 2. The second elastic connection component 72 is elastically connected to the second anchor block 1b, the second connecting beam 64 and the proof mass 2.

A third Z-axis electrode 5a is formed on the first beam column 61, and a fourth Z-axis electrode 5b is formed on the second beam column 62. The first Z-axis electrode 6a and the third Z-axis electrode 5a are disposed opposite to each other to form a first Z-axis capacitor, and the second Z-axis electrode 6b and the fourth Z-axis electrode 5b are disposed opposite to each other to form a second Z-axis capacitor. The framework 60 defines a space, and the proof mass 2 is located in the framework 60. A third X-axis electrode 3c and a third Y-axis electrode 4c are formed on the proof mass 2. The first X-axis electrode 3a and the third X-axis electrode 3c are disposed opposite to each other to form a first X-axis capacitor, and the second X-axis electrode 3b and the third X-axis electrode 3c are disposed opposite to each other to form a second X-axis capacitor. The first Y-axis electrode 4a and the third Y-axis electrode 4c are disposed opposite to each other to form a first Y-axis capacitor, and the second Y-axis electrode 4b and the third Y-axis electrode 4c are disposed opposite to each other to form a second Y-axis capacitor.

In one embodiment, the framework 60, the proof mass 2, the elastic connection components 71 and 72, and the anchor blocks 1b and 1a together form a proof mass electrode. That is, electric potentials of these components are consistent, and these components form the same electrode. For example, the framework 60, the proof mass 2, the elastic connection components 71 and 72, and the anchor blocks 1b and 1a may all be formed by conductor, semiconductor materials or composite materials so that electric potentials of these components are consistent. In this way, the proof mass electrode may provide the same electric potential for the third Z-axis electrode 5a, the fourth Z-axis electrode 5b, the third X-axis electrode 3c, and the third Y-axis electrode 4c.

With reference to FIG. 1 to FIG. 4, each of the elastic connection components 71 and 72 includes: a connecting portion 81 connected to the anchor block 1a or 1b (shown in FIG. 4); a first elastic portion 53 connected to one end of the connecting portion 81; first 66 connected to the other end of the connecting portion 81; a first elastic arm 51 connected to the first elastic portion 53; a second elastic arm 57 connected to the second elastic portion 66; a third elastic portion 54 connected between the first elastic arm 51 and the second elastic arm 57; a fourth elastic portion 55 connected between the first elastic arm 51 and a middle portion of the connecting beam; a fifth elastic portion 67 connected between the first elastic arm 51 and one side of the proof mass 2; and a sixth elastic portion 68 connected between the second elastic arm 57 and the other side of the proof mass 2. A point where the fourth elastic portion 55 is connected to the first elastic arm 51 and a point where the fourth elastic portion 55 is connected to the connecting beam is spaced by a predetermined distance D in an X axis direction (shown in FIG. 4).

As shown in FIG. 1 and FIG. 3, the fifth elastic portion 67 includes a first elastic member 41 extending in a Y axis direction and a second elastic member 42 extending in the X axis direction. The first elastic member 41 is connected to the proof mass 2, and the second elastic member 42 is connected to the first elastic arm 51. The sixth elastic portion 68 includes a first elastic member 43 extending in the Y axis direction and a second elastic member 44 extending in the X axis direction. The first elastic member 43 is connected to the proof mass 2, and the second elastic member 44 is connected to the second elastic arm 57.

As shown in FIG. 3 and FIG. 4, each of the connecting beams 63 and 64 includes a first end portion 52 connected to the first beam column 61, a second end portion 58 connected to the second beam column 62, and a middle portion located between the first end portion 52 and the second end portion 58. The middle portion of the each of the connecting beams 63 and 64 includes a neck portion 56 located on an inner side (shown in FIG. 4) and a supporting portion 59 located on an outer side. One side of the supporting portion 59 is connected to the second end portion 58, and the other side is disconnected from the first end portion 52. There is a gap between the neck portion 56 and the supporting portion 59. The neck portion 56 makes the middle portion of the connecting beam more elastic, and the supporting portion 59 makes the middle portion stronger. The fourth elastic portion 55 is connected to a midpoint position of the neck portion 56.

Figure 5:
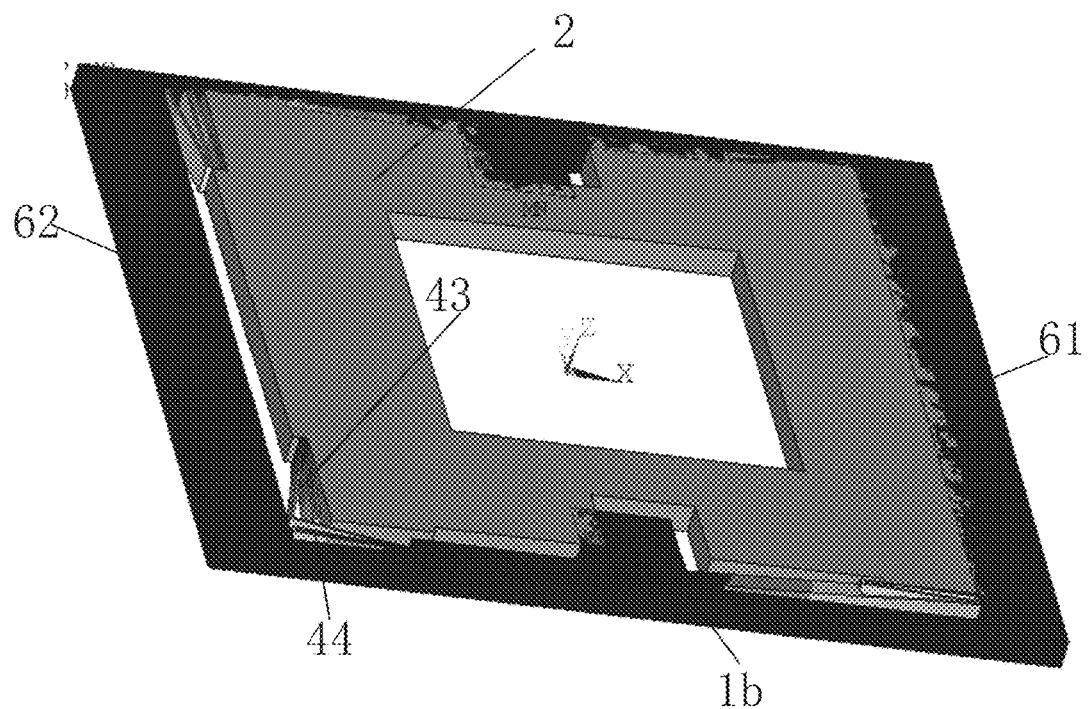
FIG. 5 is a schematic structural diagram of the three-axis accelerometer according to one embodiment of the present invention at a predetermined moment when there is an acceleration on an X axis.
Figure 6:
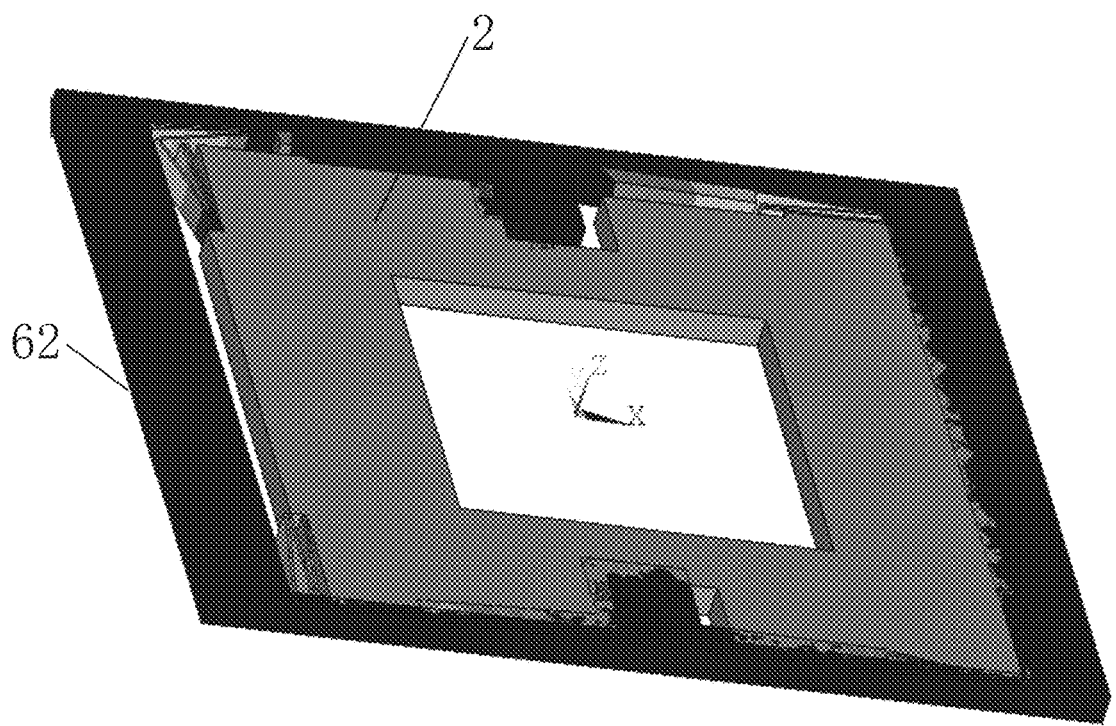
FIG. 6 is a schematic structural diagram of the three-axis accelerometer according to one embodiment of the present invention at a predetermined moment when there is an acceleration on a Y axis.
Figure 7:
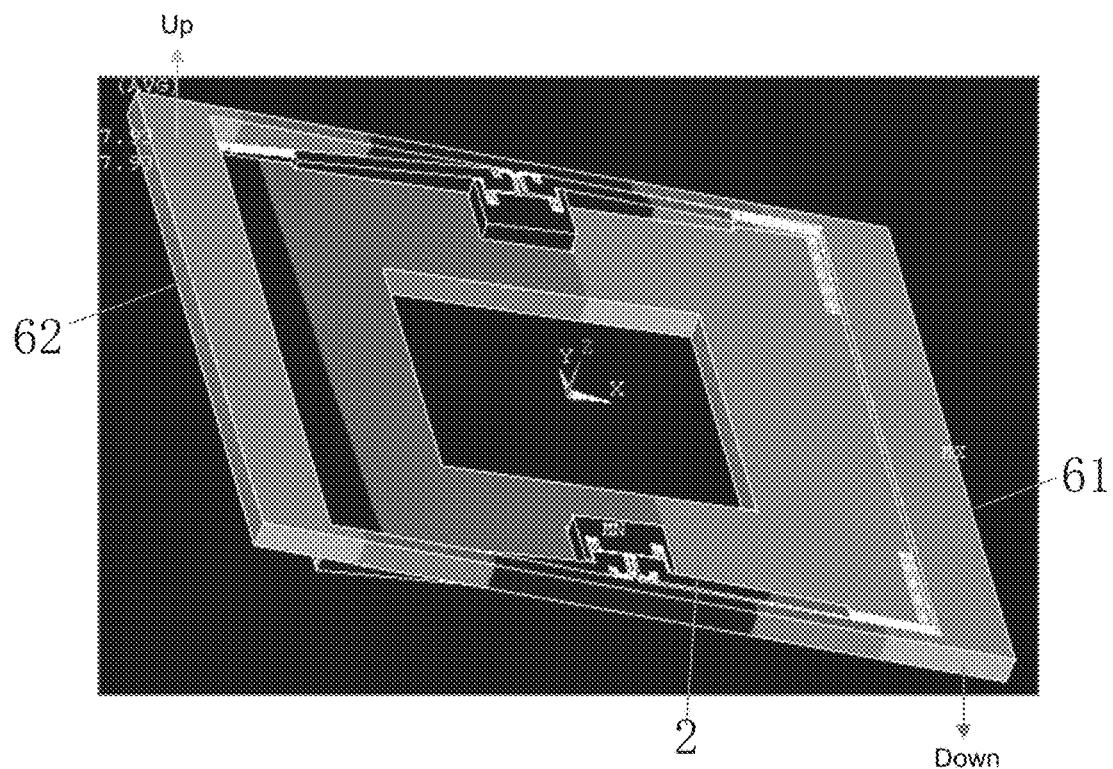
FIG. 7 is a schematic structural diagram of the three-axis accelerometer according to one embodiment of the present invention at a predetermined moment when there is an acceleration on a Z axis.

FIG. 5 is a schematic structural diagram of the three-axis accelerometer according to one embodiment of the present invention at a predetermined moment when there is an acceleration on an X axis. When there is an acceleration on the X axis, the elastic connection components 71 and 72 elastically deform, the proof mass 2 moves along the X axis, and a gap between the X-axis electrodes changes to cause change of the X-axis capacitor. For example, when a gap between the first X-axis electrode 3a and the third X-axis electrode 3c becomes larger, the first X-axis capacitor becomes smaller, and when a gap between the second X-axis electrode 3b and the third X-axis electrode 3c becomes smaller, the second X-axis capacitor becomes larger. In another example, when the gap between the first X-axis electrode 3a and the third X-axis electrode 3c becomes smaller, the first X-axis capacitor becomes larger, and when the gap between the second X-axis electrode 3b and the third X-axis electrode 3c becomes larger, the second X-axis capacitor becomes smaller. As a result, the acceleration on the X axis may be obtained by detecting a change difference between the first X-axis capacitor and the second X-axis capacitor. It needs to be known that FIG. 5, FIG. 6 and FIG. 7 are all schematic diagrams of demonstrations of a three-dimensional model of the three-axis accelerometer. In order to facilitate understanding, an action amplitude of the three-dimensional model greatly exceeds an actual action amplitude.

FIG. 6 is a schematic structural diagram of the three-axis accelerometer according to one embodiment of the present invention at a predetermined moment when there is an acceleration on a Y axis. When there is an acceleration on the Y axis, the elastic connection components 71 and 72 elastically deform, the proof mass 2 moves along the Y axis, and a change of a gap between the Y-axis electrodes causes the Y-axis capacitor to change. For example, when a gap between the first Y-axis electrode 4a and the third Y-axis electrode 4c becomes larger, the first Y-axis capacitor becomes smaller, and when a gap between the second Y-axis electrode 4b and the third Y-axis electrode 4c becomes smaller, the second Y-axis capacitor becomes larger. In another example, when the gap between the first Y-axis electrode 4a and the third Y-axis electrode 4c becomes smaller, the first Y-axis capacitor becomes larger, and when the gap between the second Y-axis electrode 4b and the third Y-axis electrode 4c becomes larger, the second Y-axis capacitor becomes smaller. As a result, the acceleration on the Y axis may be obtained by detecting a change difference between the first Y-axis capacitor and the second Y-axis capacitor.

FIG. 7 is a schematic structural diagram of a three-axis accelerometer according to one embodiment of the present invention at a predetermined moment when there is an acceleration on a Z axis. When there is an acceleration on the Z axis, the elastic connection components 71 and 72 elastically deform, the proof mass 2 moves along the Z axis, and the framework 60 rotates. A gap between the first Z-axis electrode and the third Z-axis electrode becomes larger or smaller, which causes the first Z-axis capacitor to become smaller or larger. When the gap becomes larger, the capacitor becomes smaller, and when the gap becomes smaller, the capacitor becomes larger. A gap between the second Z-axis electrode and the fourth Z-axis electrode becomes smaller or larger, which causes the second Z-axis capacitor to become larger or smaller. When the first Z-axis capacitor becomes larger, the second Z-axis capacitor becomes smaller, and when the first Z-axis capacitor becomes smaller, the second Z-axis capacitor becomes larger. As a result, the acceleration on the Y axis is obtained by detecting a change difference between the first Z-axis capacitor and the second Z-axis capacitor. For example, as shown in FIG. 7, in this case, the proof mass 2 moves downward, the first beam column 61 of the framework 60 rotates downward, the first Z-axis capacitor becomes larger, the second beam column 62 rotates upward, and the second Z-axis capacitor becomes smaller, so that the acceleration on the Z axis is further detected by detecting a change difference between the first Z-axis capacitor and the second Z-axis capacitor.

As shown in FIG. 4, the point where the first elastic arm 51 is connected to the fourth elastic portion 55 and the midpoint of the neck portion 56 of the connecting beam are spaced by the predetermined distance D in the X axis direction, namely, the structure is asymmetrical. When there is an acceleration in the Z axis direction, the entire proof mass 2 drives the framework 60 to rotate due to this asymmetrical structure, which causes the first Z-axis capacitor and the second Z-axis capacitor to change conversely, thereby obtaining a fully differential signal of the Z axis and improving the detection precision of the Z axis.

In one alternative embodiment, only one anchor block, only one connecting beam and only one elastic connection component are comprised in the three-axis accelerometer, the framework does not define a space in this embodiment, wherein the elastic connection component is elastically connected to the anchor block, the connecting beam, and the proof mass.

The foregoing descriptions are merely preferred embodiments of the present invention and are not intended to limit the present invention. Any modification, equivalent replacement, and improvement made without departing from the spirit and principle of the present invention shall fall within the protection scope of the present invention.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

What is claimed is:

1. A three-axis accelerometer, comprising:
    a substrate;
    at least one anchor block fixedly disposed on the substrate;
    a first X-axis electrode, a second X-axis electrode, a first Y-axis electrode, a second Y-axis electrode, a first Z-axis electrode and a second Z-axis electrode all fixedly disposed on the substrate;
    a framework suspended above the substrate and comprising a first beam column, a second beam column opposite to the first beam column and at least one connecting beam connecting the first beam column and the second beam column;
    a proof mass suspended above the substrate; and
    at least one elastic connection component configured to elastically connect to the at least anchor block, the connecting beam, and the proof mass;
    wherein a third Z-axis electrode is formed on the first beam column, a fourth Z-axis electrode is formed on the second beam column, the first Z-axis electrode and the third Z-axis electrode are disposed oppositely to form a first Z-axis capacitor, and the second Z-axis electrode and the fourth Z-axis electrode are disposed oppositely to form a second Z-axis capacitor; and
    wherein a third X-axis electrode and a third Y-axis electrode are formed on the proof mass, the first X-axis electrode and the third X-axis electrode are disposed oppositely to form a first X-axis capacitor, the second X-axis electrode and the third X-axis electrode are disposed oppositely to form a second X-axis capacitor, the first Y-axis electrode and the third Y-axis electrode are disposed oppositely to form a first Y-axis capacitor, and the second Y-axis electrode and the third Y-axis electrode are disposed oppositely to form a second Y-axis capacitor,
    wherein the at least one elastic connection component comprises:
    a connecting portion connected to the at least one anchor block;
    a first elastic portion connected to one end of the connecting portion;
    a second elastic portion connected to the other end of the connecting portion;
    a first elastic arm connected to the first elastic portion;
    a second elastic arm connected to the second elastic portion;
    a third elastic portion connected between the first elastic arm and the second elastic arm;
    a fourth elastic portion connected between the first elastic arm and a middle portion of the at least one connecting beam, a point where the fourth elastic portion is connected to the first elastic arm and a point where the fourth elastic portion is connected to the connecting beam being spaced by a predetermined distance in an X axis direction;
    a fifth elastic portion connected between the first elastic arm and one side of the proof mass; and
    a sixth elastic portion connected between the second elastic arm and the other side of the proof mass, and
    wherein the connecting beam comprises a first end portion connected to the first beam column, a second end portion connected to the second beam column, and a middle portion located between the first end portion and the second end portion, the middle portion of the connecting beam comprises a neck portion located on an inner side and a supporting portion located on an outer side, a gap is disposed between the neck portion and the supporting portion, one side of the supporting portion is connected to the second end portion, and the other side is disconnected from the first end portion;
    and the fourth elastic portion is connected to a midpoint of the neck portion of the connecting beam.

2. The three-axis accelerometer according to claim 1, wherein the framework, the proof mass, the at least one elastic connection component, and the at least one anchor block together form a proof mass electrode.

3. The three-axis accelerometer according to claim 1, wherein:
    when there is an acceleration on an X axis, the at least one elastic connection component elastically deforms, the proof mass moves along the X axis, a gap between the first X-axis electrode and the third X-axis electrode changes to cause change of the first X-axis capacitor, a gap between the second X-axis electrode and the third X-axis electrode changes to cause change of the second X-axis capacitor, and the changes of the first X-axis capacitor and the second X-axis capacitor are opposite, so that the acceleration on the X axis is obtained by detecting a change difference between the first X-axis capacitor and the second X-axis capacitor;
    when there is an acceleration on a Y axis, the elastic connection component elastically deforms, the proof mass moves along the Y axis, a gap between the first Y-axis electrode and the third Y-axis electrode changes to cause change of the first Y-axis capacitor, and a gap between the second Y-axis electrode and the third Y-axis electrode changes to cause change of the second Y-axis capacitor, so that the acceleration on the Y axis is obtained by detecting a change difference between the first Y-axis capacitor and the second Y-axis capacitor; and
    when there is an acceleration on a Z axis, the elastic connection component elastically deforms, the proof mass moves along the Z axis to drive the framework to rotate, a gap between the first Z-axis electrode and the third Z-axis electrode becomes larger or smaller to cause the first Z-axis capacitor to become smaller or larger, and a gap between the second Z-axis electrode and the fourth Z-axis electrode becomes smaller or larger to cause the second Z-axis capacitor to become larger or smaller, so that the acceleration on the Z axis is obtained by detecting a change difference between the first Z-axis capacitor and the second Z-axis capacitor.

4. The three-axis accelerometer according to claim 1, wherein:
- the at least one anchor block comprises a first anchor block and a second anchor block spaced apart from each other;
- the at least one connecting beam comprise a first connecting beam and a second connecting beam, two ends of each connecting beam are respectively connected to the first beam column and the second beam column, the framework defines a space, and the proof mass is located in the framework; and
- the at least one elastic connection component comprises a first elastic connection component and a second elastic connection component, the first elastic connection component is elastically connected to the first anchor block, the first connecting beam and the proof mass, and the second elastic connection component is elastically connected to the second anchor block, the second connecting beam and the proof mass.

5. The three-axis accelerometer according to claim 1, wherein each of the fifth elastic portion and the sixth elastic portion comprises a first elastic member extending in a Y axis direction and a second elastic member extending in the X axis direction, wherein the first elastic member is connected to the proof mass, and the second elastic member is connected to the first elastic arm or the second elastic arm.

* * * * *